United States Patent [19]

Kuhnert et al.

[11] Patent Number: 5,204,273

[45] Date of Patent: Apr. 20, 1993

[54] METHOD FOR THE MANUFACTURING OF A THYRISTOR WITH DEFINED LATERAL RESISTOR

[75] Inventors: Reinhold Kuhnert; Heinz Mitlehner, both of Munich; Hans-Joachim Schulze, Ottobrunn; Frank Pfirsch, Munich, all of Fed. Rep. of Germany

[73] Assignee: Siemens Aktiengesellschaft, Munich, Fed. Rep. of Germany

[21] Appl. No.: 723,800

[22] Filed: Jul. 1, 1991

[30] Foreign Application Priority Data

Aug. 20, 1990 [DE] Fed. Rep. of Germany ....... 4026318

[51] Int. Cl.$^5$ .................................. H01L 21/332
[52] U.S. Cl. ...................................... 437/6; 437/203; 437/143; 437/60; 437/918
[58] Field of Search ............... 437/6, 203, 143, 60, 437/918

[56] References Cited

U.S. PATENT DOCUMENTS

| | | | |
|---|---|---|---|
| 4,497,109 | 2/1985 | Huber et al. | 437/6 |
| 4,514,898 | 5/1985 | Przybysz et al. | 437/6 |
| 4,516,315 | 5/1985 | Przybysz et al. | 437/6 |
| 4,555,845 | 12/1985 | Przybysz | 437/6 |
| 4,605,451 | 8/1986 | Garrett | 437/6 |
| 4,757,031 | 7/1988 | Kuhnert et al. | 437/154 |
| 4,927,772 | 5/1990 | Arthur et al. | 437/6 |
| 4,929,563 | 5/1990 | Tsunoda et al. | 437/6 |
| 5,057,440 | 10/1991 | Roggwiller | 437/6 |
| 5,077,224 | 12/1991 | Schwarzbauer et al. | 437/6 |

FOREIGN PATENT DOCUMENTS

| | | | |
|---|---|---|---|
| 0303046 | 2/1989 | European Pat. Off. | 437/6 |
| 0360050 | 3/1990 | European Pat. Off. | 437/6 |
| 0366916 | 5/1990 | European Pat. Off. | 437/6 |
| 58-121672 | 7/1983 | Japan | 437/6 |

*Primary Examiner*—T. N. Quach
*Attorney, Agent, or Firm*—Hill, Steadman & Simpson

[57] ABSTRACT

Thyristor with defined lateral resistor and method for the manufacturing thereof. The thyristor has a resistor area (5) for the generation of a lateral resistor, for example between an emitter field (8) and an auxiliary emitter field (7), whereby the resistor are (5) has a defined lower doping concentration than the layer (2) surrounding it. The defined lower doping concentration is generated by recesses (3) in an occupation layer and can be adjusted by the ratio of the widths alternately arranged recesses (3) and ribs (4). The recess (3) and the ribs (4) are generated either by diffusion and subsequent etching or by implantation with an implantation mask, before the deposition layer is driven into the semiconductor body of the thyristor by heat supply from a surface.

7 Claims, 2 Drawing Sheets

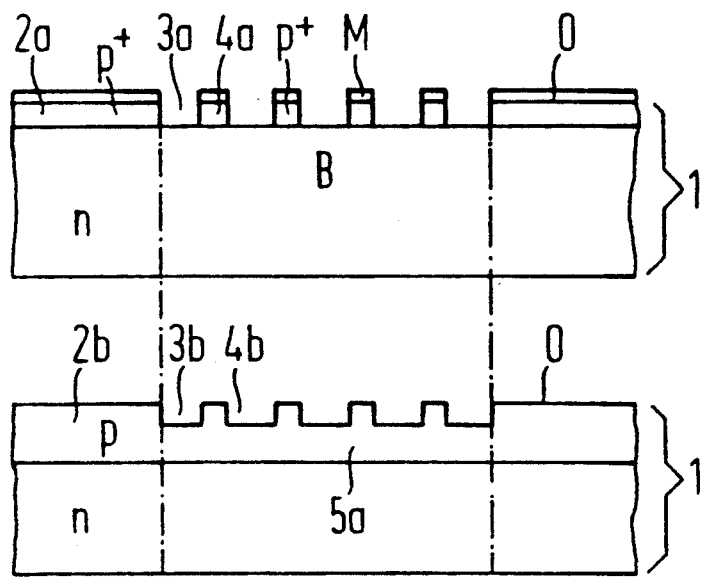
FIG 1
FIG 2
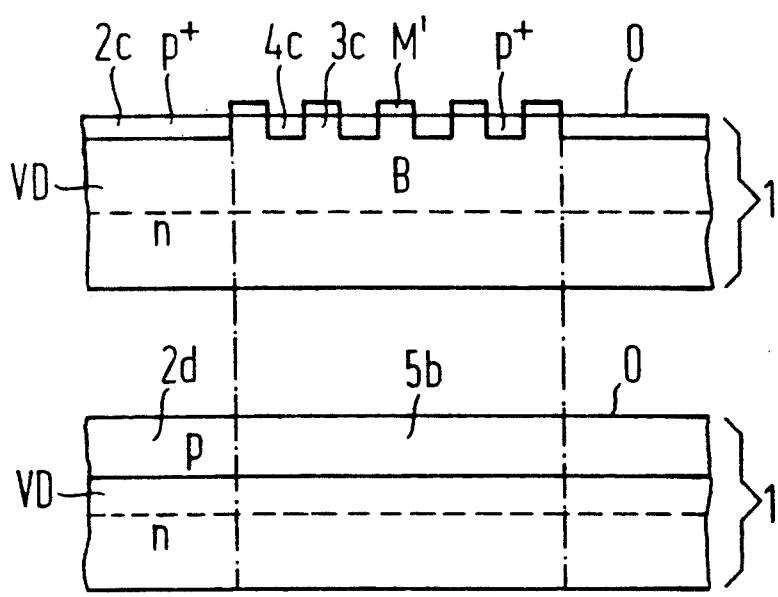

METHOD FOR THE MANUFACTURING OF A THYRISTOR WITH DEFINED LATERAL RESISTOR

BACKGROUND OF THE INVENTION

The present invention is directed to a thyristor having a lateral resistor with defined resistance, whereby the lateral resistor is composed of a resistor area located in a section of a p-base layer which is accessible from a surface of the thyristor and a method for its manufacturing.

A prior art thyristor of this type and its manufacturing method are disclosed in the conference papers of the "IEEE Internation Conference Thyristors and Variable And Static Equipment For AC and DC Transmission", 30.11.1981 to 03.12.1981 in London, in a publication contained therein of V.A.K. Temple (General Electric Company) on the subject "Advanced Light Triggered Thyristors For Electric Power Systems", particularly page 90, FIG. 7 and page 91, FIG. 10. For the thyristor with amplifying-gate-structure described by V.A.K. Temple, a lateral resistor with defined resistance is formed by first generating a p-base by diffusion and then, etching thinner the p-base at the location of the resistor to be formed.

SUMMARY OF THE INVENTION

It is an object of the present invention to provide a thyristor of the initially described type whose lateral resistor has a well reproducible resistor value and which can be integrated with minimal process-related effort. The present invention achieves this object by a thyristor in which the resistor area has a defined doping concentration lower than the doping concentration of the p-base layer surrounding it.

The advantage of the present invention is that the adjustment of the resistance values of the lateral resistor is enhanced over prior art methods.

In the present invention the thyristor can have the lateral resistor located between a region for VBO (voltage break over) protection and a gate electrode. Also the lateral resistor can be located between a gate electrode and an auxiliary emitter and/or between the auxiliary emitter and another auxiliary emitter and/or the lateral resistor can be located between an auxiliary emitter and an emitter.

A method for manufacturing the thyristor of the present invention has the following steps: in a semiconductor body of a first conductivity type a deposition layer of a second conductivity type with high doping concentration is generated starting from a surface; within an area for the resistor regularly arranged recesses are introduced in the deposition layer and respective ribs remain between the recesses; the resistor value of the lateral resistor is adjusted as defined by the width ratio of the recesses and the ribs within certain tolerances; by heating the semiconductor body the deposition layer of the second conductivity type with high doping concentration is driven into the semiconductor body; thereby a layer of the second conductivity type with lower doping concentration is generated from the deposition layer with high doping concentration; in the area for the resistor, due to the recesses a defined lower doping concentration is generated than in the layer outside the area for the resistor and due to the defined lower doping concentration in the area for the resistor the lateral resistor is generated having a resistor value that is defined within certain tolerances.

In the method the deposition layer of the second conductivity type with high doping concentration can be generated by diffusion in the semiconductor body of the first conductivity type and within the area for the resistor, regularly arranged recesses can be etched out of the deposition layer with an etching mask. The diffusion can occur with aluminum. Also, in the method the deposition layer of the second conductivity type with high doping concentration can be generated by implantation in the semiconductor body of the first conductivity type and the recesses and the ribs within the area for the resistor are generated by using an implantation mask, whereby the recesses reside respectively below impervious areas of the implantation mask. The implantation can occur with boron.

Furthermore, in the method the recesses for the generation of the lateral resistor can be generated simultaneously with regions for the generation of other functions (built-in voltage break-over protection and/or varying dopant penetration depths from the center of the body to the marginal edge to get high break down voltage). Before the generation of the deposition layer a predoping layer of the second conductivity type can be introduced in the semiconductor body over the entire area starting from the surface.

BRIEF DESCRIPTION OF THE DRAWINGS

The features of the present invention which are believed to be novel, are set forth with particularly int he appended claims. The invention, together with further objects and advantages, may best be understood by reference to the following description taken in conjunction with the accompanying drawings, in the several Figures in which like reference numerals identify like elements, and in which:

FIG. 1 is a two-part representation that depicts the manufacturing of a thyristor according to the present invention, whereby a deposition structure is generated by means of diffusion and etching steps;

FIG. 2 is a two-part representative that depicts the manufacturing of a thyristor according to the present invention, whereby a deposition structure is generated by masked implantation;

DESCRIPTION OF THE PREFERRED EMBODIMENT

Figure 3:
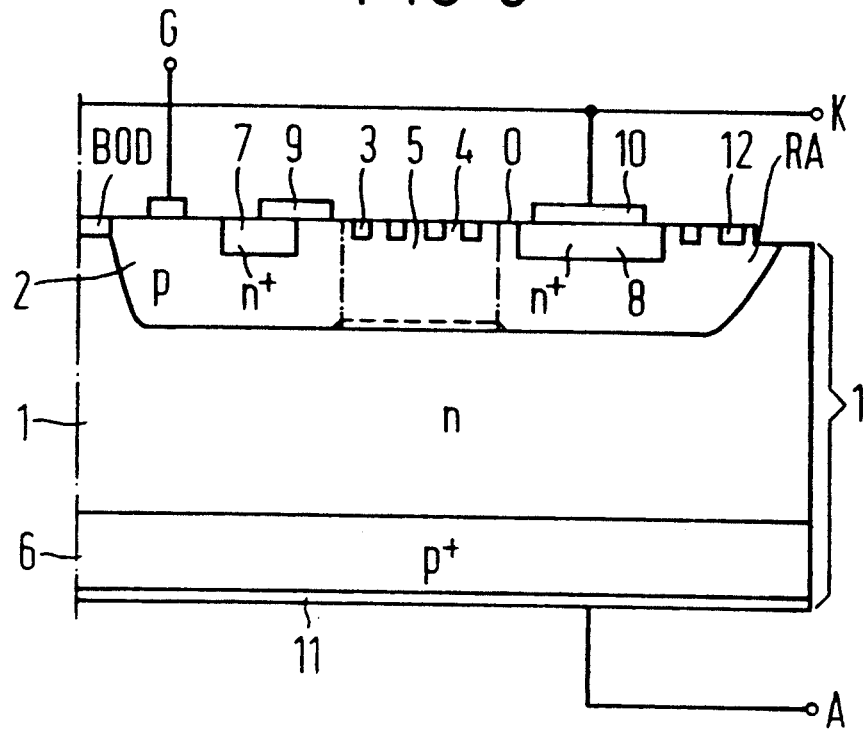
FIG. 3 is a sectional view of a thyristor of the present invention with a pilot-thyristor and a main-thyristor.

In both the upper and lower views, the two-part representation of FIG. 1 shows a region close to a boundary surface of a thyristor of the present invention into which a lateral resistor is integrated. The upper part of FIG. 1 represents the resion of the thyristor at an early time in the manufacturing process, and the lower part of FIG. 1 represents the same region of the thyristor at the end of the manufacturing process.

The upper part of FIG. 1 shows a n-doped semiconductor body 1, for example composed of silicon, into which a p$^+$-doped deposition layer 2a is introduced whose surface O is covered by an etching mask M. In an area B, for the resistor, the etching mask M and the deposition layer 2a have several regularly arranged recesses 3a, which are respectively separated from one another by ribs 4a. The bottom part of FIG. 1 shows the n-doped semiconductor body 1 in which a p-doped layer 2b is introduced which is thicker than the deposition layer 2a but which has a lower doping concentration than the deposition layer 2a. Recesses 3b and ribs 4b located at the boundary surface O have the same shape as in the upper part of FIG. 1. In the upper part of FIG. 1, the ribs 4a have the same doping concentration as the deposition layer 2a outside of the structured zone B. However, in the bottom part of FIG. 1, the ribs 4b and the entire zone 5a for the lateral resistor have a lower doping concentration than the layer 2b outside of the area B.

From the boundary surface O, a p+-doped deposition layer 2a is diffused in the n-doped semiconductor body 1 over the entire area. After this has occurred, the boundary surface O is covered with an etching mask M having regularly arranged mask openings in the area B. With subsequent etching, recesses 3a are generated in the deposition layer 2a below the mask openings, these recesses being at least as deep as the thickness of the deposition layer 2a. If the deposition layer 2a were not etched all the way through, the value of the lateral resistor would vary greatly from thyristor to thyristor due to a very steep doping profile and an etching depth that can only be inaccurately determined.

After the removal of the etching mask M, the doping atoms of the p+-doped deposition layer are driven into the n-doped semiconductor body 1 via heat supplied from the boundary surface O. The doping concentration of the original deposition layer 2a then decreases and the deposition layer extends in a vertical direction, whereby the p-doped layer 2b is generated which is relatively thick compared to the deposition layer 2a. In the area B, seen in two dimensional fashion, the ribs 4a form point-shaped doping sources for the zone 5a. The doping concentration can be easily adjusted and is defined by the relationship between the recess width and the rib width. The driving in of the doping atoms results in a largely homogeneous doping concentration within the zone 5a and thus in a well reproducible resistance value of the lateral resistor.

Similarly to FIG. 1, FIG. 2 shows a surface region close to a surface of a thyristor of the present invention in which a lateral resistor is integrated, respectively at an early time and at the end of the process. The upper part of FIG. 2 shows a n-doped semiconductor body 1 in which a thin p+-doped deposition layer 2c is introduced. Recesses 3c extend lower than impervious parts of an implantation mask M' which itself is located directly on the surface O of the deposition layer 2c, and are composed of the n-doped semiconductor body 1. The ribs 4c between the recesses 3c have the same thickness as the deposition layer 2c and are likewise p+-doped. The lower part of FIG. 2 shows a n-doped semiconductor body 1 in which a thick, p-doped layer 2d is introduced from the boundary surface O. In the area B, a zone 5b for the lateral resistor is located which has approximately the same layer thickness as the layer 2d, but a lower doping concentration than the layer 2d. Contrary to FIG. 1, the surface O is completely even within the area B, since in this case no etching occurs.

On its surface, the n-doped semiconductor body 1 is covered with an implantation mask M' such that the recesses 3c within the area B are covered. Now, a p+-doped deposition layer 2c is implanted starting from the surface O and p+-doped ribs 4c develop within the area B between the still n-doped recesses 3c below the impervious parts of the implantation mask M'. After the removal of the implantation mask M', a drive-in step occurs as described in connection with FIG. 1. Due to a temperature gradient a layer 2c with p-doping is generated which is relatively thick compared to the deposition layer, this layer 2c functioning as zone 5b for the lateral resistor within area B due to a lower doping concentration.

Instead of the uniformly p-doped semiconductor body 1, a semiconductor body 1 predoped with aluminum for example, can be used to provide an increase in blocking capability. One area VD of the semiconductor body 1 is weakly p-doped from the boundary surface O and the doping border resulting in the n-doped semiconductor body is shown as a dashed line in both parts of FIG. 2.

FIG. 3 shows a sectional view of a thyristor of the present invention with a pilot-thyristor and a main-thyristor, whereby a resistor area 5 was generated by diffusion between an auxiliary emitter electrode 9 and a cathode electrode 10 in a p-base layer 2. In the resistor area 5, the doping border line (line of equal doping concentration) between the p-layer 2 and the n-doped part of the semiconductor body 1 has an indentation, shown as a dashed line, which results from the lower doping concentration in this area. As usual, the thyristor consists of four layer, a p+-emitter layer 6, which is contacted by the anode electrode 11, a n-base composed of the semiconductor body 1, a p-base layer 2 which has developed from driving in a p+-deposition layer, and two n+-emitters 7 and 8 which are introduced in the p-base layer 2 from the surface O.

Between the thyristor center and the auxiliary emitter 7 a gate electrode G is contacted at the surface O with the p-base layer 2. The auxiliary emitter 7 is covered by the auxiliary emitter electrode 9 such that an electrical connection with the p-base layer 2 develops between the n+-emitter 7 and the resistor area 5. The emitter 8 is connected to the cathode electrode 10, the cathode electrode 10 is connected to a cathode terminal K and the anode electrode 11 is connected to an anode terminal A. In a central area of the surface O built-in voltage break-over protection BOD in the shape of an etching cavity is provided and in a border region of the surface O circular recesses 12 are provided for the generation of a varying dopant penetration depths RA from the center of the body to the marginal edge to get high break down voltage. Etched recesses 3 and ribs 4 for the generation of the resistor area 5 can advantageously be manufactured together with the voltage break-over protection BOD and the varying dopant penetration depth RA. If the recesses 3 are generated by masked implantation, this can occur together with the circular recesses 12 for the generation of the varying dopant penetration depth RA and the recess for the generation of a voltage break-over protection BOD.

Figure 4:
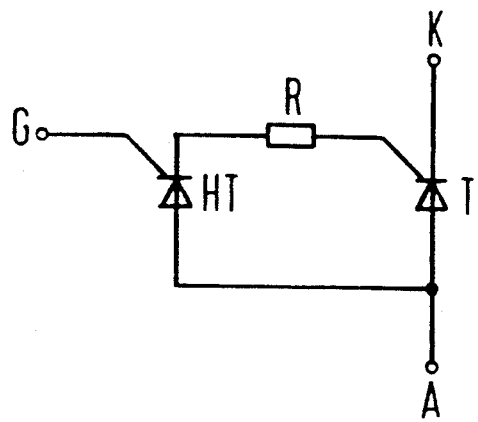
FIG. 4 is an equivalent circuit of the thyristor depicted in FIG. 3.

An equivalent circuit is depicted in FIG. 4 and describes the thyristor of FIG. 3, shows a main thyristor T between a cathode K and an anode A. A gate G is connected via a resistor R to the cathode of a pilot-thyristor auxiliary thyristor HT, whose anode is connected with the anode A of the main thyristor.

When the gate G receives a positive voltage compared to the cathode K, the pilot thyristor HT ignites. Also, multi-level the main thyristor T also subsequently ignites. Also, multi-level thyristor stages are frequently employed, which have a corresponding resistor in each individual stage, i.e. also between the auxiliary emitters.

Even between the built-in voltage break-over protection BOD and the gate electrode G or the gate electrode G and the auxiliary emitter 7, integrated lateral resistors are conceivable. In thyristors with several stages the necessary resistor values fluctuate in the range of several ten ohm. The resistance values serve as protective resistors and cause the current increase in the primary ignition field (thyristor center) to be limited and higher current intensities only occur at the ignition of subsequent stages (in the main cathode field).

The method for the manufacturing of a lateral resistor with a defined resistance is of particular significance for optically triggerable/ignitable thyristors as well as for thyristors with integrated voltage break-over protection (BOD-structure), but can possibly also be used in the manufacturing of other semiconductor components.

The invention is not limited to the particular details of the method depicted and other modifications and applications are comtemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a thyristor with integrated lateral resistor comprising the steps of: generating in a semiconductor body of a first conductivity type a deposition layer of a second conductivity type with a predetermined doping concentration starting from a surface of the semiconductor body; introducing within an area for the resistor of the semiconductor body regularly arranged recesses in the deposition layer thereby leaving respective ribs between the recesses; adjusting the resistance value of a lateral resistor as defined by a width ratio of the recesses and the ribs within given tolerances; driving, by heating the semiconductor body, the deposition layer of the second conductivity type that has a predetermined doping concentration into the semiconductor body; generating thereby a further layer of the second conductivity type with a doping concentration that is lower than the predetermined doping concentration of the deposition layer; in the area for the resistor and due to the recesses, generating a defined lower doping concentration than in the further layer outside the area for the resistor; and due to the defined lower doping concentration in the area for the resistor, generating the lateral resistor having a defined resistance value within given tolerances.

2. A method according to claim 1, wherein the deposition layer of the second conductivity type with the predetermined doping concentration is generated by diffusion in the semiconductor body of the first conductivity type and wherein, in the area for the resistor, regularly arranged recesses are etched out of the deposition layer with an etching mask.

3. The method according to claim 2, wherein the diffusion occurs with aluminum.

4. The method according to claim 1, wherein the deposition layer of the second conductivity type with the predetermined doping concentration is generated by implantation in the semiconductor body of the first conductivity type and wherein the recesses and the ribs within the area for the resistor are generated by using an implantation mask, whereby the recesses are respectively lower than the impervious areas of the implantation mask.

5. The method according to claim 4, wherein the implantation occurs with boron.

6. The method according to claim 4, wherein, before the generation of the deposition layer a predoping layer of the second conductivity type is introduced in the semiconductor body over the entire area starting from the surface.

7. The method according to claim 1, wherein the recesses for the generation of the lateral resistor are generated simultaneously with regions for the generated of at least one of a rated break point for a voltage and a border termination.

* * * * *